United States Patent
Bald et al.

(10) Patent No.: US 7,330,342 B2
(45) Date of Patent: Feb. 12, 2008

(54) SAFETY TESTER HAVING A HIGH-VOLTAGE SWITCHING RELAY PROTECTED BY AN IN-LINE ELECTRONIC CIRCUIT BREAKER

(75) Inventors: Roger A. Bald, Round Lake Beach, IL (US); Pin-Yi Chen, Taipei (TW)

(73) Assignee: Associated Research, Inc., Lake Forest, IL (US)

( * ) Notice: Subject to any disclaimer, the term of this patent is extended or adjusted under 35 U.S.C. 154(b) by 325 days.

(21) Appl. No.: 11/103,544

(22) Filed: Apr. 12, 2005

(65) Prior Publication Data

US 2006/0227479 A1  Oct. 12, 2006

(51) Int. Cl.
*H02H 3/08* (2006.01)
*H02H 9/02* (2006.01)

(52) U.S. Cl. .................... 361/93.1; 361/93.2; 361/93.6

(58) Field of Classification Search ............... 361/93.1, 361/93.6, 93.2
See application file for complete search history.

(56) References Cited

U.S. PATENT DOCUMENTS

| | | | |
|---|---|---|---|
| 4,148,088 A | 4/1979 | Meroni ..................... 361/93 |
| 4,853,820 A | 8/1989 | Ham, Jr. et al. ............... 361/59 |
| 4,979,068 A | 12/1990 | Sobhani et al. ............... 361/18 |
| 5,072,159 A * | 12/1991 | Schlenk ...................... 315/278 |
| 6,011,398 A * | 1/2000 | Bald et al. ................... 324/511 |
| 6,054,865 A | 4/2000 | Bald et al. ................... 324/551 |
| 6,178,077 B1 * | 1/2001 | Kaluza et al. ............... 361/101 |
| 6,515,484 B1 | 2/2003 | Bald et al. ................... 324/551 |
| 6,538,420 B2 | 3/2003 | Bald et al. ................... 324/114 |
| 6,744,259 B2 | 6/2004 | Bald ........................... 324/551 |
| 2002/0080544 A1 | 6/2002 | Pellegrino .................. 361/93.9 |
| 2003/0202304 A1 | 10/2003 | Canova et al. ............. 361/93.1 |

FOREIGN PATENT DOCUMENTS

GB  0 392 733  * 10/1990

* cited by examiner

*Primary Examiner*—Michael Sherry
*Assistant Examiner*—Zeev Kitov
(74) *Attorney, Agent, or Firm*—Bacon & Thomas, PLLC

(57) ABSTRACT

A multiple function safety compliance test instrument includes a high voltage output switching relay protected by a solid state in-line circuit breaker.

12 Claims, 4 Drawing Sheets

SAFETY TESTER HAVING A HIGH-VOLTAGE SWITCHING RELAY PROTECTED BY AN IN-LINE ELECTRONIC CIRCUIT BREAKER

BACKGROUND OF THE INVENTION

1. Field of the Invention

This invention generally relates to the field of electrical safety compliance testing, and more particularly to a multiple function safety compliance test instrument that includes:
- a high voltage output switching relay for selectively supplying power from either a line voltage source or a high voltage source to a device under test (DUT); and
- a circuit breaker for protecting the high voltage output switching relay from high currents.

The invention replaces the conventional circuit breaking relay or fuse with a protective circuit that includes transistors connected in series between the line voltage source and the switching relay, the transistors having a relatively small ON resistance to enable the transistors to carry currents during the entire test time and not just at start-up. The short turn-off time of the series-connected transistors reduces the current-carrying requirements of the high voltage output switching relay, enabling the use of a medium rather than high current relay to handle switching between the line voltage source and the high voltage source.

2. Description of Related Art

Electrical safety compliance test instruments are used by manufacturers to test electrical products for hazards such as insulation or ground faults that could cause injuries to purchasers and users of the products. Conventional safety compliance tests include continuity, ground bond, AC and DC dielectric withstand or "hipot," insulation resistance, line leakage, and run tests. For convenience, it is common for safety compliance instruments to be capable of performing more than one of these tests.

Descriptions of various types of safety compliance tests and multi-function safety compliance test instruments may be found in commonly-assigned U.S. Pat. Nos. 6,011,398; 6,054,865; 6,515,484; 6,538,420; and 6,744,259, incorporated by reference herein. Each of the multiple function safety compliance test instruments disclosed in these patents includes a high voltage source, a low voltage power source, and a switching matrix for selectively supplying high or low voltages from the respective sources to a DUT via output ports. One of the output ports in the switching matrix serves as a neutral or ground, while the other port is connected to a high voltage switching relay that is, in turn, connected to the high voltage source and to a source of low voltage, such as a power main or line voltage source.

Line voltage tests typically involve higher currents (277V/15 A) than high voltage tests (5KV/40 mA). Short circuits that occur in the DUT during line voltage tests, or that occur during changing of a test set-up, can draw sufficient current to damage the high voltage switching relay. As a result, it is conventional to connect a fuse or circuit breaker between the line voltage source and the switching relay. The circuit breaker conventionally takes the form of a mechanical line voltage source controlling relay responsive to a current sensor. Transistors are used to momentarily turn on the power supply to the DUT, but then are bypassed by the mechanical relay to eliminate the heating and voltage drops that occur in the transistors.

Because of the relatively slow reaction time of relays (or fuses), which permits currents to exceed or overshoot a shut-off threshold before shut-off can actually occur, a typical high voltage switching relay protected by a conventional fuse or relay must be capable of handling both high voltages from the high voltage source and high currents from the line voltage source. The line voltage source controlling relay and the switching relay are both relatively expensive components and contribute significantly to the overall cost and size of the safety compliance test instrument.

The present invention replaces the relay or fuse with solid state circuitry. Examples of known solid state or electronic circuit breaker circuitry are disclosed in U.S. Pat. Nos. 4,148,088; 4,853,820; and 4,979,068; and U.S. Patent Publication Nos. 2002/0080544 and 2003/0202304. However, none of the conventional solid state circuit breaker arrangements is suitable for use in a safety compliance test instrument, which by definition must be capable of handling currents and voltages in excess of those normally handled to the products being tested. Because line voltage tests require a relatively high current even during a normal run, the ON resistance of a transistor used in a conventional electronic circuit breaker is sufficient to cause a significant voltage drop, and consequent heating, precluding use of the transistor as an in-line circuit breaker without the addition of a large heat sink. As a result, circuit-breaking relays rather than electronic circuit breakers continue to be used in all commercially-available safety compliance test instruments.

SUMMARY OF THE INVENTION

It is a first objective of the invention to provide a multiple function electrical test instrument having lower cost and a smaller size without sacrificing safety or reliability.

It is a second objective of the invention to provide a safety compliance test instrument that includes a high voltage but medium current output relay having a smaller size and lower cost than a conventional high voltage, high current switching output relay.

It is a third objective of the invention to provide a safety tester of the type having a high voltage output switching relay for switching between a high voltage source and a low or line voltage source, and in which the output switching relay is protected by an in-line electronic circuit breaker as an alternative to large expensive relays and expensive, slow circuit breakers or fuses.

It is a fourth objective of the invention to provide a circuit breaker for protecting the high voltage switching relay of a multiple function safety compliance test instrument that is used during a test run as well as during start-up, without the need to switch from electronic circuitry to a mechanical relay.

It is a fifth objective of the invention to provide an electronic circuit breaker suitable for use in a multiple function safety compliance tester that meets the above objectives.

These objectives are accomplished by providing a multiple function safety test instrument, and a protective circuit for the test instrument, in which the conventional relay or fuse used to protect the high voltage output switching relay is replaced by a solid state in-line circuit breaker, the solid state in-line electronic circuit breaker including a transistor with a relatively low ON resistance, and the in-line transistor being controlled by overload detection, shut-off, and reset circuitry that utilizes elements of the existing zero-cross start-up circuitry to provide high-speed current interrupting capabilities.

According to a preferred embodiment of the invention, the protective circuit includes a current transformer, signal conditioning circuitry, a current shutdown setpoint, and a comparator that is used to detect an overload current. When the maximum current is detected, the latch will trip and immediately turn off the gate drive to the transistors, thereby interrupting the current. A CPU controls the reset logic and resets the latch only after the output relays have been disconnected from the output short circuit and a start-up signal has been disabled. The start-up signal to the electronic circuit breaker is initiated by the CPU and driven by the zero-cross circuits so the transistors are activated only at the zero voltage level of the input power sine wave. The gate drive will only activate the transistors when both the start-up signal is active and the latch from the maximum current detector has been reset and current is at a safe level. Therefore, the CPU or the over current protection can shut down the transistors at any time.

It will be appreciated by those skilled in the art that the present invention can be applied to any safety compliance instrument that includes a high voltage output switching relay for switching a line voltage source, and further that the principles of the invention may be extended to protect output switching relays for a source other than a line voltage source, so long as the source is subject to overload current outputs that could damage the switching relay.

In addition, those skilled in the art will appreciate that while the invention is specifically adapted for use in multiple function safety compliance test equipment, it is not intended to be limited to any specific type of multiple function safety compliance test instrument. Instruments to which the electric circuit breaker of the invention may be applied include, but are not limited to, those described in U.S. Pat. Nos. 6,011,398; 6,054,865; 6,515,484; 6,538,420; and 6,744,259, as well as any other multiple function safety compliance test instrument having a high voltage switching relay for selectively connecting a DUT to high and line voltage sources, and that might be used during design, manufacture, and final inspection of a product.

DETAILED DESCRIPTION OF THE PREFERRED EMBODIMENTS

Figure 1:
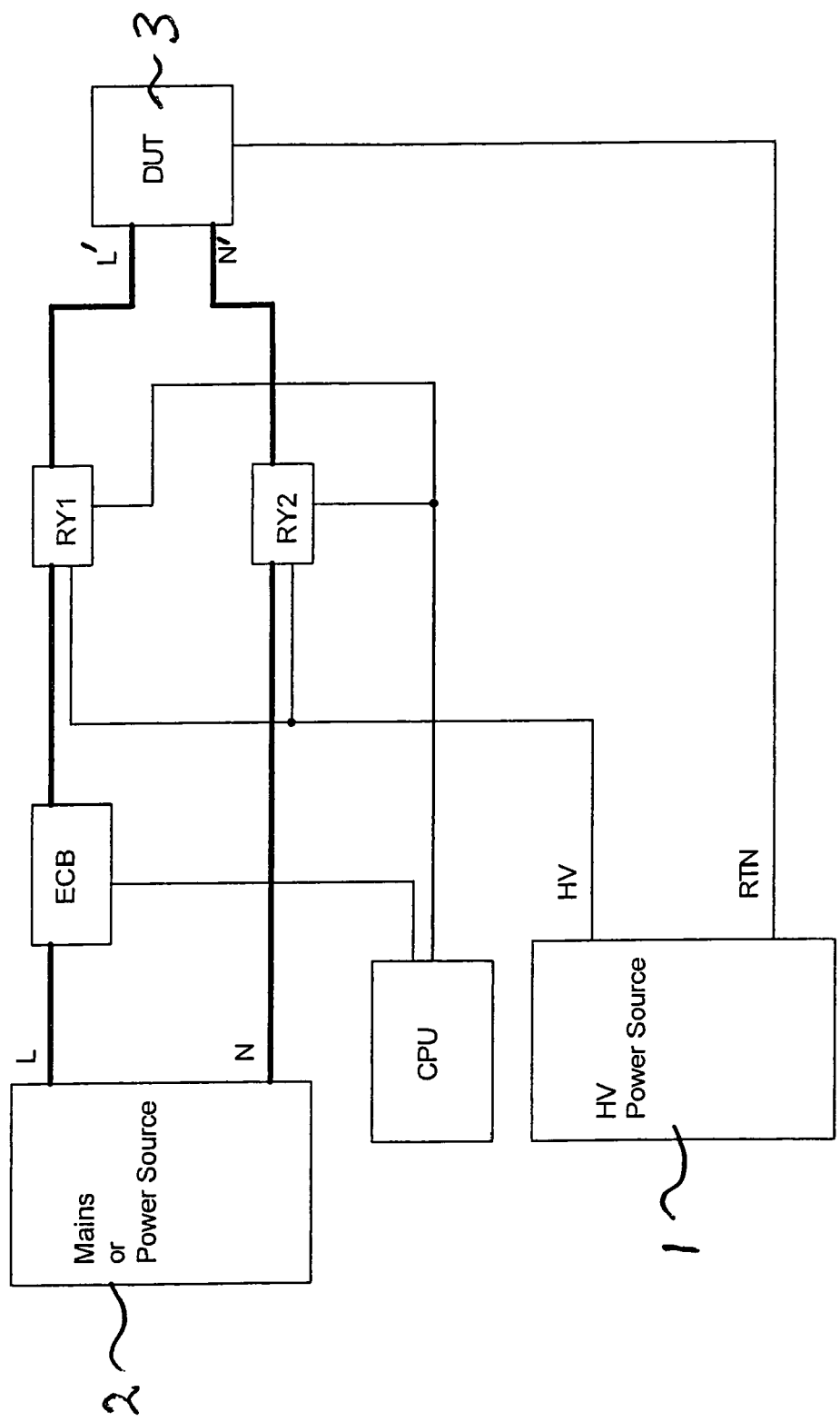
FIG. 1 is a functional block diagram of a preferred safety tester that includes a high voltage output switching relay protected by an in-line electronic circuit breaker.

As illustrated in FIG. 1, the preferred safety compliance test instrument includes a high voltage power source 1 having a high voltage output HV and a return RTN, and a mains or line voltage power source 2 having a live output L and a neutral N. High voltage output HV of high voltage source 1 and line voltage output L of line voltage source 2 are selectively connected to a DUT 3 via a corresponding port L' of the test instrument and high voltage relay RY1. The neutral connection between the line voltage source neutral N and the neutral output N' of the test instrument is switched by a second output switching relay RY2, which may also be connected to high voltage source output HV in order to provide a second output port for high voltage tests. The DUT return is typically directly connected to return RTN of the high voltage source. A central processing unit CPU controls switching of the respective relays RY1 and RY2 according to the type of test to be run. Appropriate operator interfaces and control circuitry for the relays are disclosed in detail in the above-cited U.S. Pat. Nos. 6,011,398; 6,054,865; 6,515,484; 6,538,420; and 6,744,259 and do not constitute part of the present invention.

Those skilled in the art will appreciate that the low and high voltage sources may either be internal sources or connections to external sources. For example, the low voltage is often provided by an input connector, which passes the line voltage to the DUT output connector. As used herein, the term "source" is therefore intended to encompass both power supply units and connections to an external source.

Figure 2:
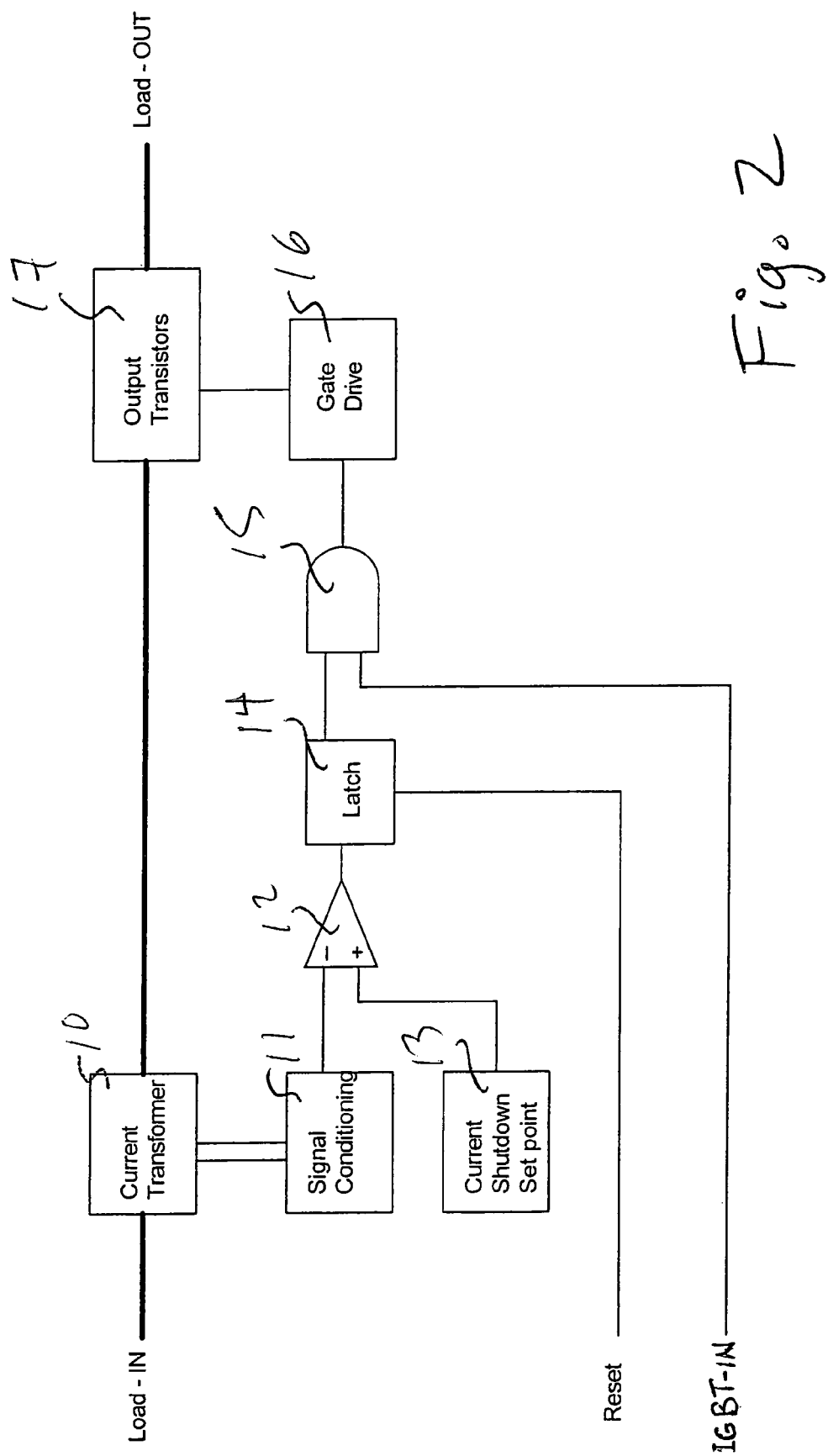
FIG. 2 is a functional block diagram of a safety tester circuit for use in the safety tester of FIG. 1.

FIG. 2 shows details of the electronic circuit breaker ECB. The electronic circuit breaker includes a current transformer 10 for monitoring the current being output by the power source 2. Such current transformers are well-known and the invention is not limited to a particular type of current transformer 10. The current transformer is connected to corresponding signal conditioning circuitry 11, which again is well-known and not to be taken as a limiting example. The signal conditioned by circuitry 11, which is representative of the current output by source 2, is applied to one terminal of a comparator 12. The other terminal of comparator 12 is connected to a reference or "set point" 13 which determines the current level at which shut off is triggered. The signal output by comparator 12 when the current is less than the set point is latched in latch 14, and supplied to gate 15 in order to trigger a gate drive 16. Gate drive 16 controls the gate or gates of at least one series-connected transistor 17 to permit the supply of current from the source 2 to the output relay RY1. When an over-current is sensed, the corresponding signal is no longer output by the comparator, which causes the latch to output a low signal to the gate 15 and turn-off transistor(s) 17. For a line operated circuit breaker, at least two transistors 17 are required, although it is within the scope of the invention to use a single transistor, for example in connection with a DC low voltage source rather than a line voltage source. The number of transistors may also be more than two since inclusion of a greater number of parallel-connected transistors increases current handling capacity.

In operation, whenever an overload current is detected the comparator 12 illustrated in FIG. 2 will trip the latch 14, and immediately turn off the gate drive 16 to the transistors 17, thereby interrupting the current. The central processing unit CPU controls the reset logic and resets the latch 14 by means of the RESET signal only after the output switching relays RY1 and/or RY2 have been disconnected from an output short circuit and the start-up signal has been disabled. The start-up signal to the electronic circuit breaker corresponds to the start-up signal used in a conventional solid state start-up circuit, which is activated prior to switching to a mechanical relay, and is driven by the zero-cross circuits so the transistors are activated only at the zero voltage level of the input power sine wave to prevent arcing. The gate drive 16 will only activate the transistors when both the start-up signal is active and the latch from the overload current detector has been reset and current is at a safe level, as determined by the AND logic circuit 15, so that the central processing unit CPU or the over current protection can shut down the transistors 17 at any time.

Figure 3:
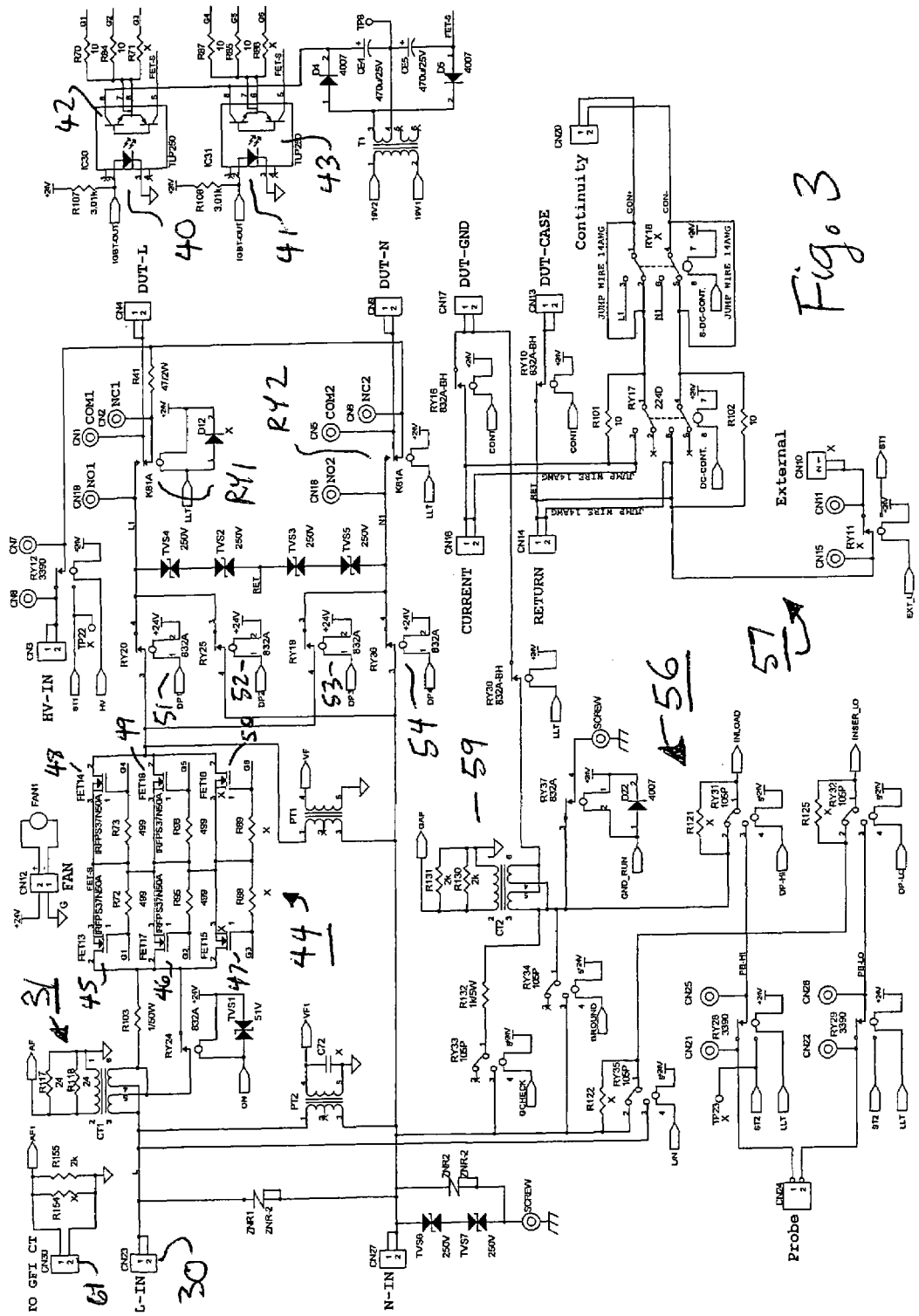
FIG. 3 and FIG. 4 are detailed circuit diagrams of a specific implementation of a safety compliance test instrument constructed in accordance with the principles of the preferred embodiment illustrated in FIG. 1.
Figure 4:
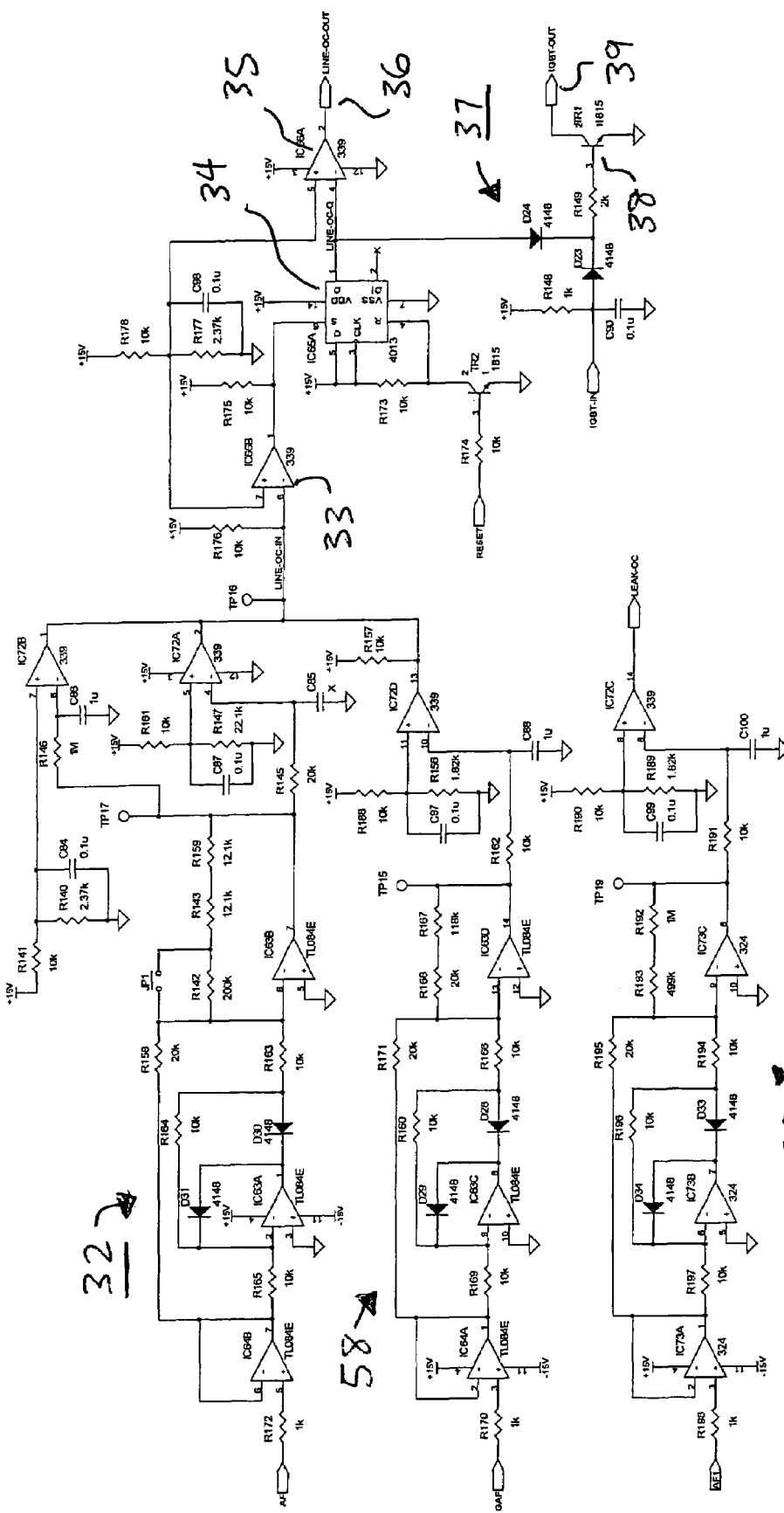

FIGS. 3 and 4 show details of the power supply circuitry for a multiple test instrument capable of performing both high and low voltage tests, including line leakage tests using a probe corresponding to the one described in U.S. Pat. No. 6,011,398. Details of the test circuitry, except as described below, form no part of the present invention and have been omitted from the following description and drawings.

The line voltage power supply terminal or jumper 30 is connected to a current transformer circuit 31 arranged to output a signal AF representative of the current output by the line voltage source. The current transformer is in turn connected to signal conditioning circuitry 32 (shown in FIG. 4), which includes integration and pulse-shaping circuitry, as is well-known, so as to provide the negative input to comparator 33. The output of comparator 33 in turn sets the Q output of flip-flop 34 to low. The central processing unit is notified of the status of the line voltage output via comparator 35 and output 36, while the resulting low input to AND logic circuit 37 turns off the transistor 38.

AND logic circuit 37 causes transistor 38 to conduct if the signal IGBT-IN or the Q output of flip flop 34 is pulled to a high level due to controlled turn off from the CPU or an overload-current condition, respectively. Zero-cross signal IGBT-IN is generated in conventional fashion when the central processing unit outputs a signal to a zero-cross detection circuit (not shown) connected to the mains or power source 2. Alternatively, it is possible for a signal corresponding to IGBT-IN to be generated directly by the CPU, or by an alternative circuit, and for the illustrated AND logic circuit 37, which consists of zener diodes and transistor 38, to be replaced by an integrated logic circuit or other signal combining components.

Transistor 38 is connected to LEDs 40,41 of the gate drive circuit, which are optically coupled to photodetectors 42,43 arranged to generate and supply signals G1-G6 to the in-line protective circuit 44, consisting of FETs 45-50. FETs are preferred because of their low source-to-drain resistance and high speed, although it is within the scope of the invention to substitute other types of solid state switch devices with appropriate characteristics. FETs 45-50 are connected in parallel to each other and in series between line voltage input 30 and either of the two output switching relays RY1 and RY2. Optionally, additional switching relays 51-54 may be connected between FETs 45-50 for reversing the polarity of the line and neutral outputs.

In addition to the line switching circuit that connects line voltage input 30 to switching relays RY1,RY2 (and optional polarity reversing relays 51-54), the illustrated tester includes a probe switch circuit 56 for controlling a probe used in conducting continuity and line leakage tests, and a switching circuit 57 including various relays for switching between the high voltage return and ground connections used in line leakage tests. The current fault detection circuitry shown in FIG. 4 further includes signal conditioning circuitry 58 for processing the output of line leakage detecting transformer 59 (shown in FIG. 3) and supplying the output to comparator 33 for monitoring by the central processing unit, and signal conditioning circuitry 60 which receives input from a ground fault interrupter circuit connected via jumper 61 for shutting off leakage currents.

Having thus described a preferred embodiment of the invention in sufficient detail to enable those skilled in the art to make and use the invention, it will nevertheless be appreciated that numerous variations and modifications of the illustrated embodiment may be made without departing from the spirit of the invention, and it is intended that the invention not be limited by the above description or accompanying drawings, but that it be defined solely in accordance with the appended claims.

We claim:

1. A multifunction test instrument, comprising:
   a low voltage source;
   a high voltage source;
   an output port for connection to a device under test (DUT);
   a switching relay for selectively connecting either the low voltage source or the high voltage source to the output port;
   a protective circuit including at least one transistor connected in series between the low voltage source and the output port, and a current detection circuit for controlling said transistor in response to detection of a current drawn from said low voltage source by said DUT, wherein when said current is below a threshold during a test, said current detection circuit drives said transistor to conduct current from said low voltage source to said DUT via said switching relay, and wherein when current exceeding said threshold is detected, said transistor is cut-off to prevent supply of said current exceeding said threshold to said switching relay.

2. A multiple function safety tester as claimed in claim 1, wherein said transistor circuit comprises at least one FET.

3. A multiple function safety tester as claimed in claim 2, wherein said transistor circuit comprises a plurality of FETs, each connected in series between the line voltage source and the switching relay, and each mutually connected in parallel.

4. A multiple function safety tester as claimed in claim 1, wherein said current detection circuit comprises a current transformer, signal conditioning circuitry, a comparator for comparing a signal output by said signal conditioning circuitry with said threshold, a latch, and gate drive circuitry.

5. A multiple function safety tester as claimed in claim 4, wherein said current detection circuit further comprises an AND logic circuit having as one input an output of said latch, and as a second input a start-up signal supplied by a zero-crossing circuit.

6. A multiple function safety tester as claimed in claim 4, wherein said latch is reset by a reset signal generated by a central processing unit.

7. A multiple function safety tester as claimed in claim 1, wherein said safety tester is arranged to perform high voltage dielectric withstand tests.

8. A multiple function safety tester as claimed in claim 1, wherein said safety tester is arranged to perform low voltage tests selected from the group consisting of line leakage tests and run tests.

9. An electronic circuit breaker for a multiple function safety tester, comprising an in-line transistor circuit including at least one transistor arranged to be connected in series between a low voltage source and a switching relay, transformer means for detecting a level of current conducted by said in-line transistor circuit, signal conditioning circuitry connected to said transformer means, a comparator connected to said signal conditioning circuit for comparing detected current with a set point, a latch for latching an output of said comparator, and an AND logic circuit having one input connected to said latch and a second output connected to a start-up signal generating circuit, said AND logic circuit being connected to a gate drive circuit for controlling a gate of the at least one transistor to supply current to the switching relay during a test run, and for cutting of said current when an overcurrent is detected by said transformer means.

10. An electronic circuit breaker as claimed in claim 9, wherein said start-up signal generating circuit is a zero-crossing circuit.

11. An electronic circuit breaker as claimed in claim 9, wherein said latch is reset by a reset signal generated by a central processing unit.

12. An electronic circuit breaker as claimed in claim 9, wherein said low voltage source is a connection to a line voltage, and said in-line transistor circuit includes at least two transistors.

* * * * *